US010734334B2

(12) United States Patent
Jacobs et al.

(10) Patent No.: US 10,734,334 B2
(45) Date of Patent: Aug. 4, 2020

(54) COAXIAL-INTERCONNECT STRUCTURE FOR A SEMICONDUCTOR COMPONENT

(71) Applicant: Marvell World Trade Ltd., St. Michael (BB)

(72) Inventors: Marc Jacobs, Redwood City, CA (US); Lijuan Zhang, Fremont, CA (US)

(73) Assignee: MARVELL ASIA PTE, LTD., Singapore (SG)

( * ) Notice: Subject to any disclaimer, the term of this patent is extended or adjusted under 35 U.S.C. 154(b) by 0 days.

(21) Appl. No.: 16/133,381

(22) Filed: Sep. 17, 2018

(65) Prior Publication Data

US 2019/0237418 A1 Aug. 1, 2019

Related U.S. Application Data

(60) Provisional application No. 62/623,416, filed on Jan. 29, 2018.

(51) Int. Cl.
| | |
|---|---|
| *H01L 23/34* | (2006.01) |
| *H01L 23/66* | (2006.01) |
| *H01L 23/552* | (2006.01) |
| *H05K 1/02* | (2006.01) |
| *H01L 23/498* | (2006.01) |

(52) U.S. Cl.
CPC ........ *H01L 23/66* (2013.01); *H01L 23/49827* (2013.01); *H01L 23/552* (2013.01); *H05K 1/0222* (2013.01); *H01L 2223/6622* (2013.01); *H05K 2201/09809* (2013.01)

(58) Field of Classification Search
CPC . H01L 23/66; H01L 23/49827; H01L 23/552; H05K 1/0222
USPC ........................................................ 257/728
See application file for complete search history.

(56) References Cited

U.S. PATENT DOCUMENTS

| | | | | |
|---|---|---|---|---|
| 6,812,401 | B2 * | 11/2004 | Karrmann | ............ H01B 7/0233 |
| | | | | 174/113 C |
| 7,906,730 | B2 * | 3/2011 | Atkinson | ........... H01R 13/6592 |
| | | | | 174/78 |
| 9,184,113 | B1 * | 11/2015 | Sridhar | ................. H01L 21/486 |
| 9,368,440 | B1 * | 6/2016 | Hool | ...................... H01L 23/481 |
| 10,020,249 | B2 * | 7/2018 | Gagne | ................. H01L 23/5384 |
| 10,451,652 | B2 * | 10/2019 | Sinsheimer | .......... G01R 1/0491 |

* cited by examiner

*Primary Examiner* — David S Blum

(57) ABSTRACT

The present disclosure describes a coaxial-interconnect structure that is integrated into a semiconductor component and methods of forming the coaxial-interconnect structure. The coaxial interconnect-structure, which electrically couples circuitry of an integrated-circuit (IC) die to traces of a packaging substrate, comprises a signal core elongated about an axis, a ground shield elongated about the axis, and an insulator disposed between the signal core and the ground shield.

20 Claims, 12 Drawing Sheets

Section A-A

COAXIAL-INTERCONNECT STRUCTURE FOR A SEMICONDUCTOR COMPONENT

CROSS REFERENCE TO RELATED APPLICATION

This present disclosure claims priority to U.S. Provisional Patent Application Ser. No. 62/623,416 filed Jan. 29, 2018, the disclosure of which is incorporated by reference herein in its entirety.

BACKGROUND

The background description provided herein is for the purpose of generally presenting the context of the disclosure. Unless otherwise indicated herein, the approaches described in this section are not prior art to the claims in this disclosure and are not admitted to be prior art by inclusion in this section.

In the wireless-network industry, a semiconductor component may operate at high-speed frequencies that exceed, for example, 2.4 gigahertz (GHz). To accommodate such high-speed frequencies and improve signal performance of the semiconductor component, a packaging substrate or an integrated-circuit (IC) die of the semiconductor component may incorporate structures that include ground planes or ground traces.

The semiconductor component may also include interconnect structures in the form of conductive pillars. Such interconnect structures, typically fabricated directly onto pads of the IC die, serve as a mechanism for attaching the IC die to the substrate and also provide a conduit for signals emanating from circuitry of the IC die. Today, design and fabrication techniques associated with the interconnect structures leave adjacent interconnect structures exposed to one another. In contrast to the efforts associated with incorporating ground plane or ground trace structures in portions of the semiconductor component, the exposed nature of the interconnect structures can result in signal degradation due to signal losses or signal interferences.

SUMMARY

This summary is provided to introduce subject matter that is further described in the Detailed Description and Drawings. Accordingly, this Summary should not be considered to describe essential features nor used to limit the scope of the claimed subject matter.

The present disclosure describes a coaxial-interconnect structure that is integrated into a semiconductor component and methods of forming the coaxial-interconnect structure. The coaxial interconnect-structure, which electrically couples circuitry of an integrated-circuit (IC) die to traces of a packaging substrate, includes a signal core elongated about an axis, a ground shield elongated about the axis, and an insulator disposed between the signal core and the ground shield.

In some aspects, a semiconductor component is described. The semiconductor component comprises a packaging substrate having corresponding signal and ground traces that are formed from separate conductive layers of the packaging substrate, an integrated-circuit (IC) die having signal and ground pads, and a coaxial-interconnect structure that electrically couples the signal and ground pads of the IC die to corresponding signal and ground traces of the packaging substrate. The coaxial-interconnect structure comprises a signal core elongated about an axis that is (i) orthogonal to a plane of the IC die that contains the signal and ground pads and (ii) orthogonal to a plane of the packaging substrate that contains the corresponding signal and ground traces. The coaxial-interconnect structure also comprises a ground shield elongated about the axis and disposed such that in encloses a perimeter of the signal core and an insulator disposed between the signal core and the ground shield.

In other aspects, a semiconductor component is described. The semiconductor component comprises a packaging substrate having corresponding signal and ground traces that are formed from a common conductive layer of the packaging substrate, an integrated-circuit (IC) die having signal and ground pads, and a coaxial-interconnect structure that electrically couples the signal and ground pads of the IC die to the corresponding signal and ground traces of the packaging substrate. The coaxial-interconnect structure comprises a signal core elongated about an axis that is (i) orthogonal to a plane of the IC die that contains the signal and ground pads and (ii) orthogonal to planes of the packaging substrate that contain the corresponding signal and ground traces. The coaxial-interconnect structure also comprises a ground shield elongated about the axis and disposed such that it encloses a portion of a perimeter encircling the signal core and an insulator disposed between the signal core and the ground shield.

In yet other aspects, a method of forming a coaxial-interconnect structure is described. The method comprises depositing, onto a material stack that includes a signal interconnect pad, a first conductive material and depositing, onto the first conductive material, a first coating of photoresist material. Via a first photolithography operation that includes irradiating and removing a same portion of the first coating of photoresist material, a portion of the first conductive material is exposed. A second conductive material is deposited onto the exposed portion of the first conductive material. A remaining portion of the first coating of photoresist material is removed to expose a portion of the first conductive material and the exposed portion of the first conductive material is etched to render a signal core that is elongated about an axis. A dielectric material is deposited onto the material stack, including the signal core, and a second coating of photoresist material is deposited onto the dielectric material. Via a second photolithography operation that includes irradiating and removing a same portion of the second coating of photoresist material, a portion of the dielectric material is exposed. The exposed portion of the dielectric material is removed, and a remaining portion of the second coating of photoresist material is removed to render an insulator that is elongated about the axis. A third conductive material is deposited onto the material stack, including the signal core and the insulator, and a third coating of photoresist material is deposited onto the third conductive material. Via a third photolithography operation that includes irradiating and removing a same portion of the third coating of photoresist material, a portion of the third conductive material is exposed. The exposed portion of the third conductive material is removed, and a remaining portion of the third coating of photoresist material is removed to render a ground shield that is elongated about the axis. The signal core, the insulator, and the ground shield are then polished to render the coaxial interconnect structure.

The details of one or more implementations are set forth in the accompanying drawings and the following description. Other features and advantages will be apparent from the description and drawings, and from the claims.

BRIEF DESCRIPTION OF THE DRAWINGS

The details of one or more aspects of coaxial-interconnect structure are described below. The use of the same reference numbers in different instances in the description and the figures may indicate like elements.

DETAILED DESCRIPTION

As part of manufacturing a semiconductor component, an integrated-circuit (IC) die can be combined with a packaging substrate (sometimes referred to as an interposer) during an assembly manufacturing process to render the semiconductor component. Interconnect structures of the semiconductor component electrically couple the die to the packaging substrate for propagation of signals between the IC die and the packaging substrate. In certain instances, the interconnect structures include electrically conductive wire-bonds that connect to pads of the IC die to pads of the packaging substrate, while in other instances, the interconnect structures might be bumps in the form of pillars or solder balls that connect the pads of the IC die to the pads of the substrate.

Wire-bonds may be fabricated using materials such as aluminum (Al), copper (Cu), silver (Ag), or gold (Au). However, due to their length, wire-bonds are prone to signal losses due to parasitics associated with inductance.

Pillars may be fabricated from materials such as copper (Cu). Pillars, in general, have improved high frequency signaling performance when compared to wire-bonds due, in part, to their reduced lengths. However, as part of a conventional semiconductor component manufacturing process, either during a wafer fabrication process or a package assembly process, such pillars are exposed to neighboring pillars, subjecting each of the pillars to interferences or "cross-talk" from respective, neighboring pillars.

A novel interconnect structure, relying on semiconductor manufacturing processes, incorporates a signaling core, a dielectric, and a shield as part of a coaxial signaling mechanism that is disposed between an integrated-circuit (IC) die and a packaging substrate. The coaxial-interconnect structure achieves improved signaling performance for high frequency signals that might be used as part of semiconductor component operating at high frequencies (e.g., >2.4 GHz). The present disclosure describes methods and apparatuses for fabricating such a coaxial interconnect structure as part of a semiconductor component.

Operating Environment

Figure 1:
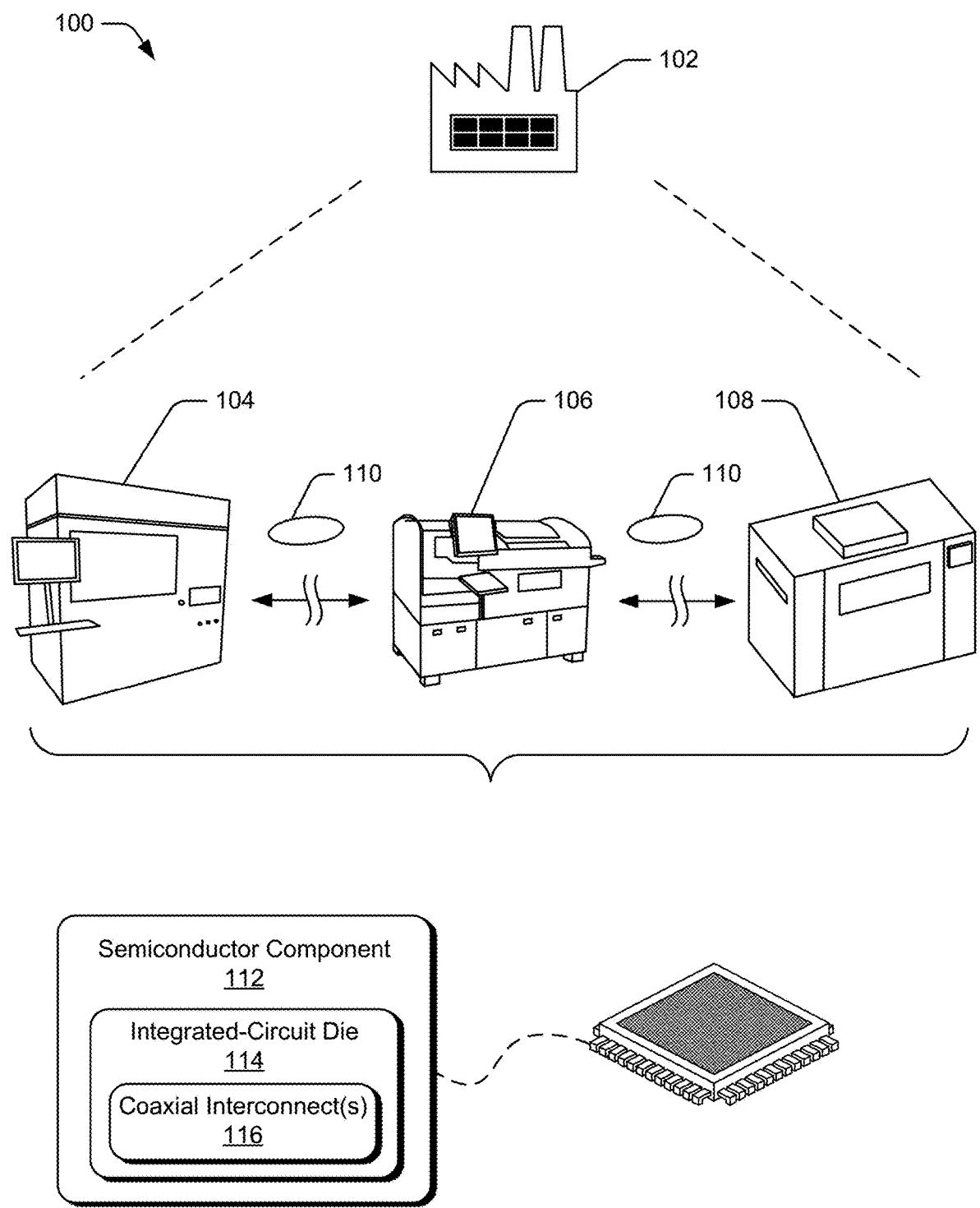
FIG. 1 illustrates an example operating environment for fabricating a semiconductor component having a coaxial-interconnect structure in accordance with one or more implementations.

FIG. 1 illustrates an example operating environment 100 for fabricating a semiconductor component having a coaxial-interconnect structure in accordance with one or more implementations.

As illustrated, a semiconductor-wafer fabrication facility 102 includes a group semiconductor-wafer manufacturing tools. The group of semiconductor-wafer manufacturing tools includes a plating tool 104, a photolithography-exposure tool 106, and an etch tool 108. In general, the group of semiconductor-wafer manufacturing tools may perform sequences of manufacturing process steps to a semiconductor wafer 110.

A semiconductor component 112 may be assembled to include an integrated-circuit (IC) die 114 having one or more coaxial interconnects 116. Examples of the IC die 114, as typically associated with very large scale integrated (VLSI) circuitry, include a logic die, an application-specific integrated circuit (ASIC) die, a system-on-chip (SoC) die, a memory die such as a dynamic random access memory (DRAM) die or a flash memory die, or the like. In one aspect, sequences of manufacturing process steps that utilize the plating tool 104, the photolithography-exposure tool 106, and the etch tool 108 can fabricate the coaxial-interconnects 116 onto multiples of the IC die 114 contained on the semiconductor wafer 110 prior to the semiconductor wafer 110 being diced for assembling into multiples of the semiconductor component 112.

In general, the plating tool 104 may use electrochemical deposition processes to deposit, or "grow", various metals onto exposed metals of the IC die 114. The exposed metals, sometimes referred to as seed metals or an under-bump metallization (UBM) metals, are generally conductive metals in the form of pads that provide respective electrical conduits to circuitry of the IC die 114. Examples of metals the plating tool 104 may deposit include copper (Cu), gold (Au), nickel (Ni), palladium (Pd), silver (Ag), and tin (Sn). The plating tool 104 may deposit materials used in the construct of the coaxial interconnects 116, including materials that might be used for signal cores or ground shields.

Other deposition tools (not illustrated) may also be used to deposit materials onto the semiconductor wafer 110. Other deposition tools include chemical vapor deposition (CVD) tools, physical vapor deposition (PVD) tools, and sputtering tools. In certain instances, the other deposition tools may deposit dielectric materials onto the semiconductor wafer while in other instances, the other deposition tools may be used in place of the plating tool 104 to deposit the aforementioned metals.

In general, the photolithography-exposure tool 106 exposes, or radiates, energy or particles, such as ultraviolet light (UV), extreme-ultraviolet (EUV) light, electron-beams, ion-beams, or x-ray electromagnetic waves through a patterned photolithography mask and onto the thin film of photoresist material coating the semiconductor wafer 110. A pattern corresponding to the patterned photolithography mask, as received by the thin film of photoresist, may be developed by a developing tool (not illustrated) to mask portions of material (e.g., material deposited by the plating tool 104) from processes that include removal via an etch-manufacturing process. Operations performed by the photolithography-exposure tool 106 may, in effect, mask features from etching during the construct of the coaxial interconnects 116.

In general, the etch tool 108 removes exposed (e.g., unmasked) portions of material to render features that correspond to patterns developed as part of operations performed by the photolithography-exposure tool 106. The etch tool 108 may remove the exposed portions of material via a dry-etch process, a wet-etch process, or the like. Etchants used by the etch tool 108 may be tailored to react with one or more materials (e.g., etch the one or more materials) while remaining benign (e.g., not etch) to other materials.

The etch tool 108 may be used during the construct of the coaxial interconnects 116 to etch features that define the coaxial interconnects 116.

Multiple operations of plating, exposure, and etching may be performed within the operating environment 100 to form the coaxial interconnects 116 onto the semiconductor wafer 110 prior to the semiconductor wafer 110 being diced for assembling into multiples of the semiconductor component 112. It is worth noting that in certain, alternate operating environments (not illustrated), it is possible to form the coaxial interconnects 116 onto a packaging substrate (using other tools performing similar operations) as opposed to the semiconductor wafer 110. Such alternate operating environments may include an assembly or packaging facility (not illustrated) where final operations complete manufacturing of the semiconductor component 112.

Figure 2:
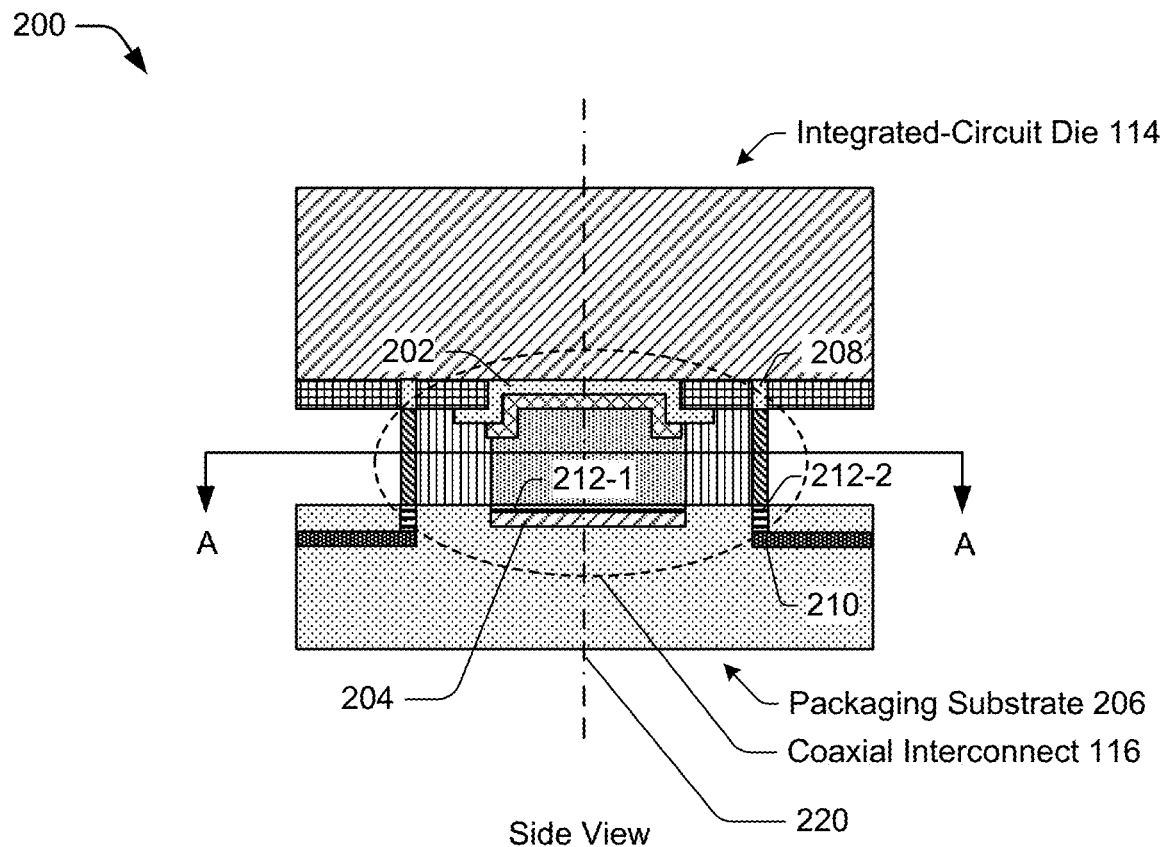
FIG. 2 illustrates details of an example coaxial-interconnect structure in accordance with one or more implementations.
Figure 2:
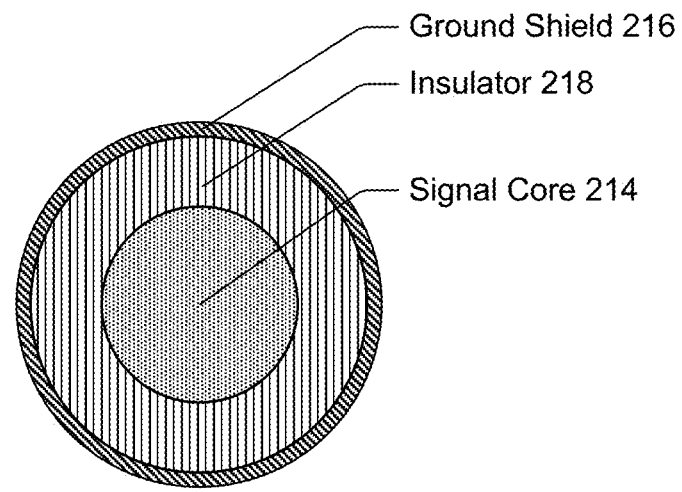

FIG. 2 illustrates details 200 of an example coaxial-interconnect structure in accordance with one or more implementations. The coaxial-interconnect structure may be the coaxial interconnect 116 of FIG. 1 as contained in the semiconductor component 112 of FIG. 1.

As illustrated by the side view (a cross-section view of a portion of the semiconductor component 112), the coaxial interconnect 116 electrically couples a signal pad 202 of the IC die 114 to a corresponding signal trace 204 of a packaging substrate 206. In this example instance, the packaging substrate may be a multiple-layer printed circuit board (PCB) formed from composite fiber-based epoxy materials and includes multiple layers of conductive materials such as copper (Cu), aluminum (Al), or the like.

The coaxial interconnect 116 also electrically couples a ground pad 208 of the IC die 114 to a corresponding ground trace 210 of the packaging substrate 206. Furthermore, as illustrated in this example coaxial-interconnect structure, the corresponding signal trace 204 and the corresponding ground trace 210 are formed from separate conductive layers of the packaging substrate 206. As part of the overall coaxial-interconnect structure, a conductive material such as a tin lead (Sn—Pb) soldering material (illustrated by elements 212-1 and 212-2) may be included as part of the coaxial-interconnect structure.

As illustrated by the section A-A view of FIG. 2, the coaxial interconnect 116 is comprised of a signal core 214, a ground shield 216, and an insulator 218. The signal core 214 may be, for example, a conductive material that is a copper (Cu) material, a titanium (Ti) material, or a tungsten (W) material. The ground shield 216 may be, for example, a conductive material that is a copper (Cu) material or a tin (Sn) material. The insulator 218 may be, for example, a dielectric material that is a polyimide (PI) material, a polybenzoxazole (PBO) material, or a borophosphosilicate glass (BPSG) material.

As with this example of the coaxial interconnect 116, the ground shield 216 completely encloses a perimeter of the insulator 218 and a perimeter of the signal core 214.

Further, as illustrated in FIG. 2, the coaxial interconnect 116 (e.g., each of the signal core 214, the ground shield 216, and the insulator 218) is elongated about an axis 220 that is orthogonal to a plane of the IC die 114 that contains the signal pad 202 and the ground pad 208. The axis 220 is also orthogonal to planes of the packaging substrate 206 that contain the corresponding signal trace 204 and the corresponding ground trace 210. The orthogonality is but one example, however, and in certain instances the coaxial interconnect 116 may be "near" orthogonal or even "offset". In such instances, alternate manufacturing techniques may result in the axis 220 being +/−15° with respect to a theoretical axis that is orthogonal to a plane of the packaging substrate 206.

Figure 3:
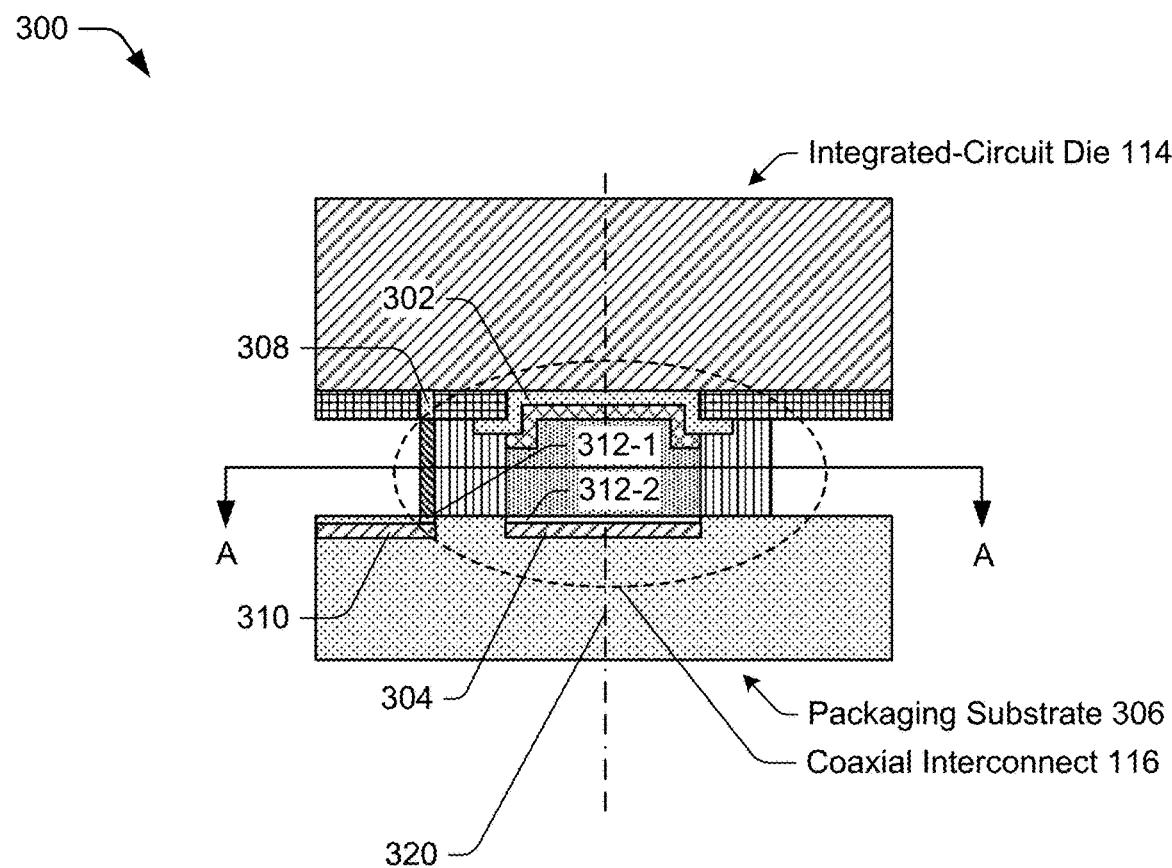
FIG. 3 illustrates details of another example coaxial-interconnect structure in accordance with one or more implementations.
Figure 3:
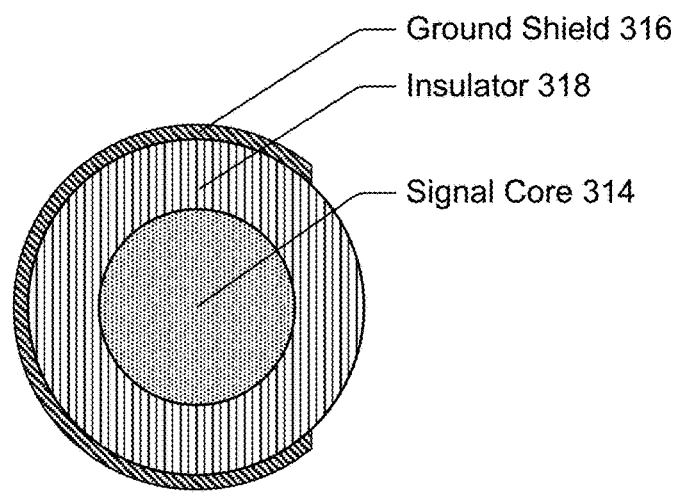

FIG. 3 illustrates details 300 of an example coaxial-interconnect structure in accordance with one or more implementations. The coaxial-interconnect structure may be the coaxial interconnect 116 of FIG. 1 as contained in the semiconductor component 112 of FIG. 1.

As illustrated by the side view (a cross-section view of a portion of the semiconductor component 112), the coaxial interconnect 116 electrically couples a signal pad 302 of the IC die 114 to a corresponding signal trace 304 of a packaging substrate 306. In this example instance, the packaging substrate is a single-layer printed circuit board (PCB) formed from composite fiber-based epoxy material and includes a layer of conductive material such as copper (Cu), aluminum (Al), or the like.

The coaxial interconnect 116 also electrically couples a ground pad 308 of the IC die 114 to a corresponding ground trace 310 of the packaging substrate 306. Furthermore, as illustrated in this example coaxial-interconnect structure, the corresponding signal trace 304 and the corresponding ground trace 310 are formed from a common conductive layer of the packaging substrate 306. As part of the overall coaxial-interconnect structure, a conductive material such as a tin lead (Sn—Pb) soldering material (illustrated by elements 312-1 and 312-2) may be included as part of the coupling.

As illustrated by the section A-A view of FIG. 3, the coaxial interconnect 116 is comprised of a signal core 314, a ground shield 316, and an insulator 318. The signal core 314 may be, for example, a conductive material that is a copper (Cu) material, a titanium (Ti) material, or a tungsten (W) material. The ground shield 316 may be, for example, a conductive material that is a copper (Cu) material or a tin (Sn) material. The insulator 318 may be, for example, a dielectric material that is a polyimide (PI) material, a polybenzoxazole (PBO) material, or a borophosphosilicate glass (BPSG) material.

As with this example of the coaxial interconnect 116, the ground shield 316 encloses a portion of a perimeter of the insulator 318 and a portion of a perimeter of the signal core 314.

Further, as illustrated in FIG. 3, the coaxial interconnect 116 (e.g., each of the signal core 314, the ground shield 316, and the insulator 318) is elongated about an axis 320 that is orthogonal to a plane of the IC die 114 that contains the signal pad 302 and the ground pad 308. The axis 320 is also orthogonal a plane of the packaging substrate 306 that contain the corresponding signal trace 304 and the corresponding ground trace 310. The orthogonality is but one example, however, and in certain instances the coaxial interconnect 116 may be "near" orthogonal or even "offset". In such instances, alternate manufacturing techniques may result in the axis 220 being +/−15° with respect to a theoretical axis that is orthogonal to a plane of the packaging substrate 206.

As illustrated in FIG. 3, the discontinuous nature of the ground shield 316 enables electrical coupling to a single layer packaging substrate (e.g., the packaging substrate 306 having the corresponding signal trace 304 and the corresponding ground trace 310 formed from the common conductive layer). Other ground shields having similar discontinuous natures may be formed, such as a ground shield formed having multiple segments, or "columns", to enable electrical coupling to a single layer packaging substrate.

Techniques for Fabricating a Coaxial-Interconnect Structure

Figure 4A:
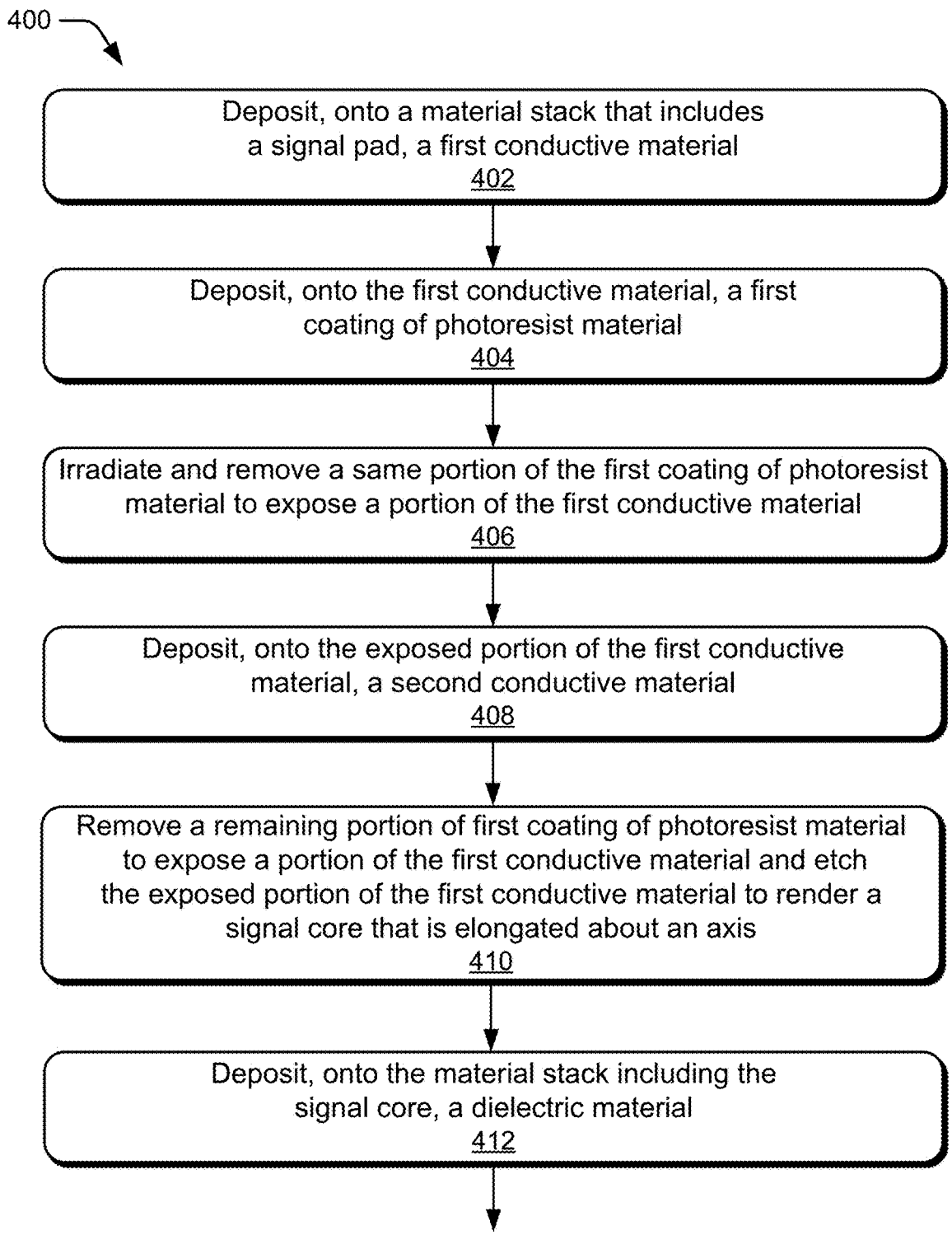
FIGS. 4a-4c illustrate an example method of fabricating an integrated-circuit die to have a coaxial-interconnect structure in accordance with one or more implementations.
Figure 4B:
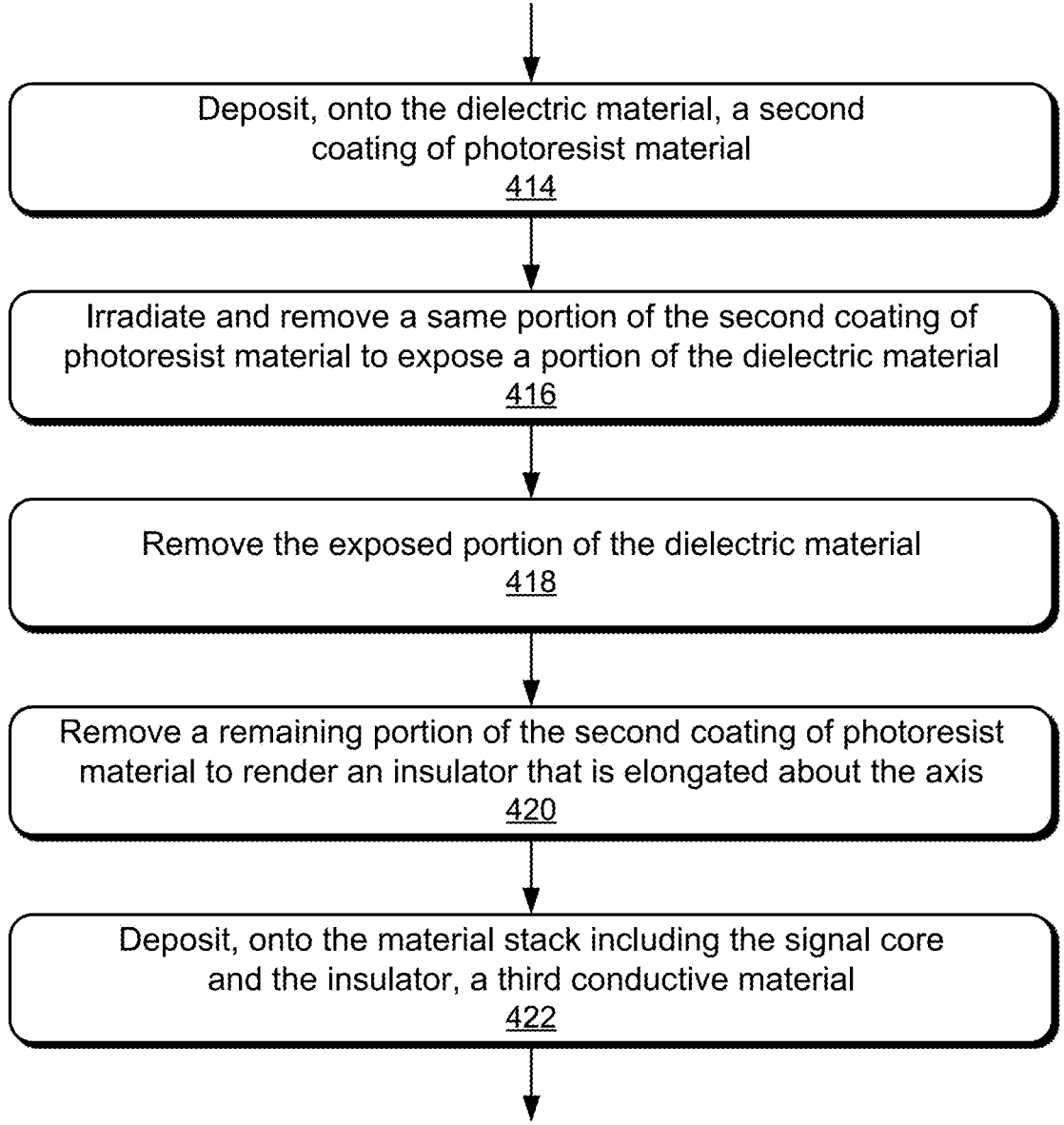
Figure 4C:
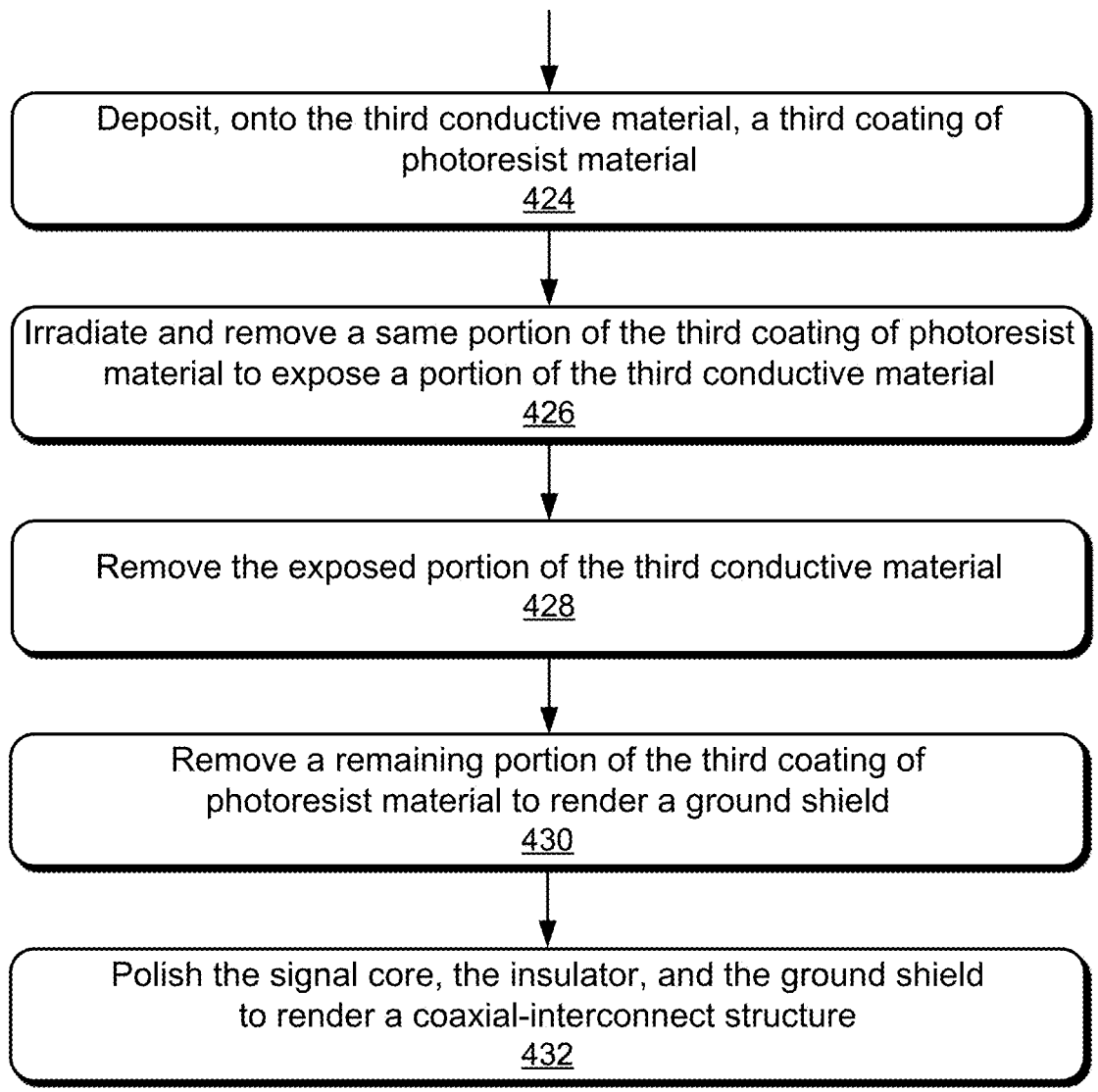

FIGS. 4a-4c illustrate an example method 400 for fabricating an integrated-circuit die to have a coaxial-interconnect structure in accordance with one or more implementations. The coaxial-interconnect structure may be the coaxial-interconnect(s) 116 of FIG. 1. The group of semiconductor-wafer manufacturing tools of FIG. 1 (e.g., the plating tool 104, the photolithography-exposure tool 106, and the etch tool 108) may be used to fabricate the coaxial-interconnect 116 onto the IC die 114. FIGS. 5a-5f illustrate example details 500 of cross sections of the integrated-circuit die 114 having the coaxial-interconnect 116 during various stages of fabrication in accordance with one or more implementations. Furthermore, FIGS. 5a-5f are complementary to operations performed by example method 400 if the example method 400 is not altered.

At 402 of FIG. 4a, operations deposit a first conductive material onto a material stack that includes a signal pad. The material stack may be that of an integrated-circuit die (e.g., the IC die 114) associated with a given state of work in process (WIP).

Figure 5A:
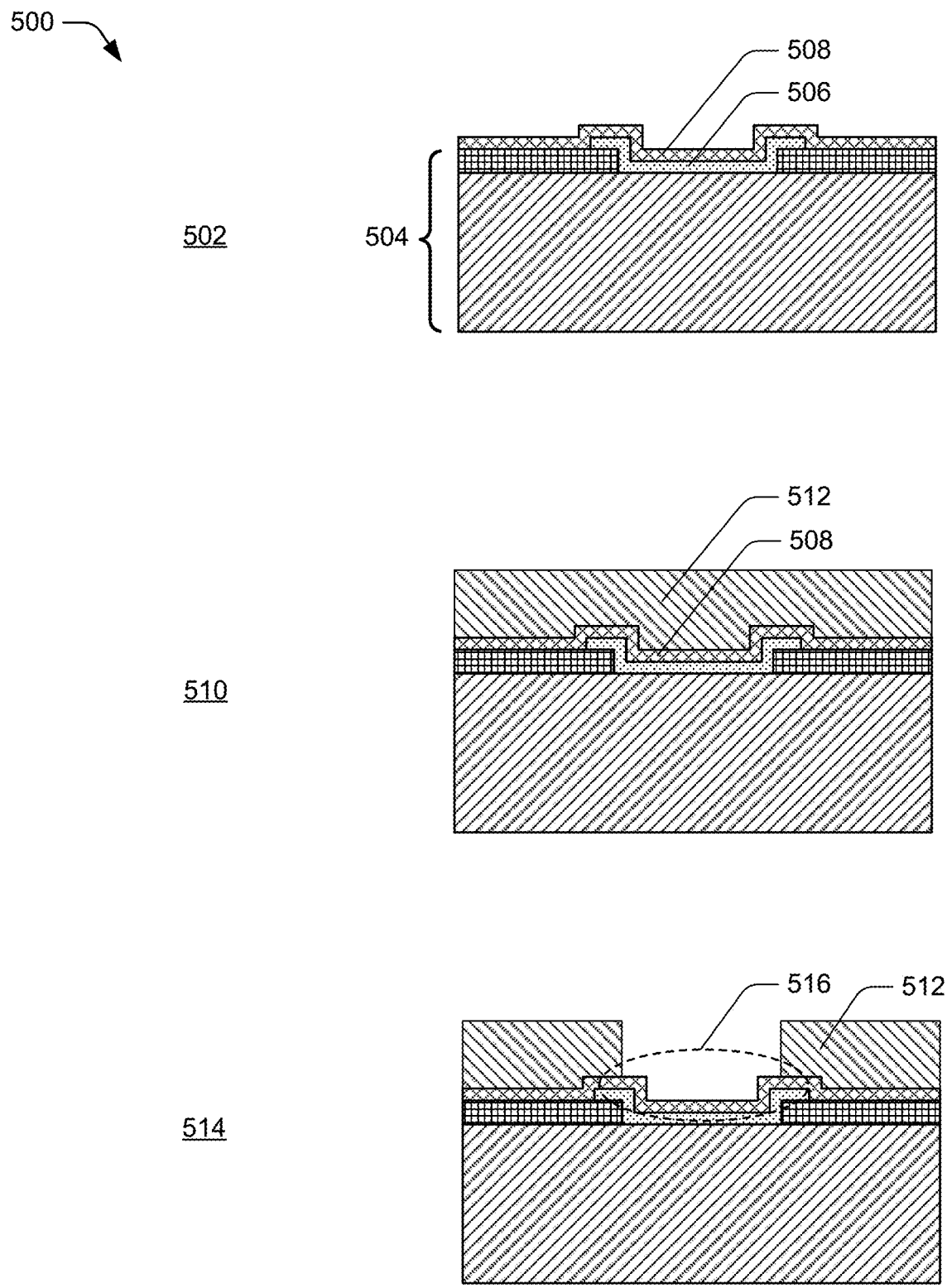
FIGS. 5a-5f illustrate example details of cross sections of an integrated-circuit die having a coaxial-interconnect structure during various stages of fabrication in accordance with one or more implementations.

In the context of the present example and as shown by details 500 of FIG. 5a, the operation 502 is performed on a material stack 504. A signal pad 506 is included as part of the material stack 504. As illustrated, a first conductive material 508 is deposited onto the material stack 504 (including the signal pad 506). The first conductive material 508 may be deposited by, for example, a sputtering tool, a chemical vapor deposition (CVD) tool, or a physical vapor deposition tool (not illustrated in FIG. 1) and may be a composition of under bump metallization (UBM) materials that include, for example, one or more of the elements titanium (Ti), nickel (Ni), copper (Cu), tungsten (W), aluminum (Al), chromium (Cr), or vanadium (V). The signal pad 506 may be electrically coupled to functional circuitry of the IC die 114, such as an input or output (I/O) of the IC die 114.

Proceeding with the method 400, and as illustrated at 404 of FIG. 4a, operations deposit a first coating of photoresist material onto the first conductive material. The photoresist material may be a positive photoresist material that, when irradiated by an energy source, changes properties such that the photoresist material (that is irradiated) may be removed by a developing tool. In the setting of the ongoing example and as illustrated at operation 510 of FIG. 5a, a first coating of photoresist material 512 is deposited onto the first conductive material 508 by a coating tool (not illustrated in FIG. 1).

Continuing with the method 400, at 406 of FIG. 4a, a first photolithography operation irradiates and removes a same portion of the first coating of photoresist material to expose a portion of the first conductive material. In this example instance, the photoresist material is a "positive" photoresist material. The photolithography-exposure tool 106 of FIG. 1 may, with the assistance of a photolithography mask that is configured to mask a pattern of irradiation across the IC die 114, irradiate a same portion of the first coating of photoresist material as that which is subsequently removed via a developing tool (not illustrated in FIG. 1). In view of the ongoing example and as illustrated at operation 514 of FIG. 5a, a same portion (not illustrated) of the first coating of photoresist material 512 has been irradiated and removed to reveal a portion of the first conductive material 516.

At 408 of FIG. 4a, the method 400 continues. Operations deposit a second conductive material onto the exposed portion of the first conductive material. For example, the plating tool 104 of FIG. 1 may deposit a material such as a copper (Cu) material via an electrodeposition process. Other example materials that may be deposited onto the exposed portion of the first conductive material, by the plating tool 104 of FIG. 1 or another tool such as a chemical vapor deposition (CVD), physical vapor deposition (PVD), or sputtering tool include a titanium (Ti) material or a tungsten (W) material. In the context of the ongoing example and as illustrated at operation 518 of FIG. 5b, a second conductive material 520 is deposited onto the exposed portion of the first conductive material 516.

Proceeding with the method 400, at 410 of FIG. 4a, operations include removing a remaining portion of the first coating of photoresist material to expose a portion of the first conductive material and etching the exposed portion of the first conductive material to render a signal core that is elongated about an axis. For example, an ashing tool (not illustrated in FIG. 1) may remove a remaining portion of the first coating of photoresist material while the etch tool 108 of FIG. 1 may remove an exposed portion of the first conductive material. In such an instance, the etch tool 108 may utilize an etchant to which the first conductive material reacts but to which the second conductive material does not.

Figure 5B:
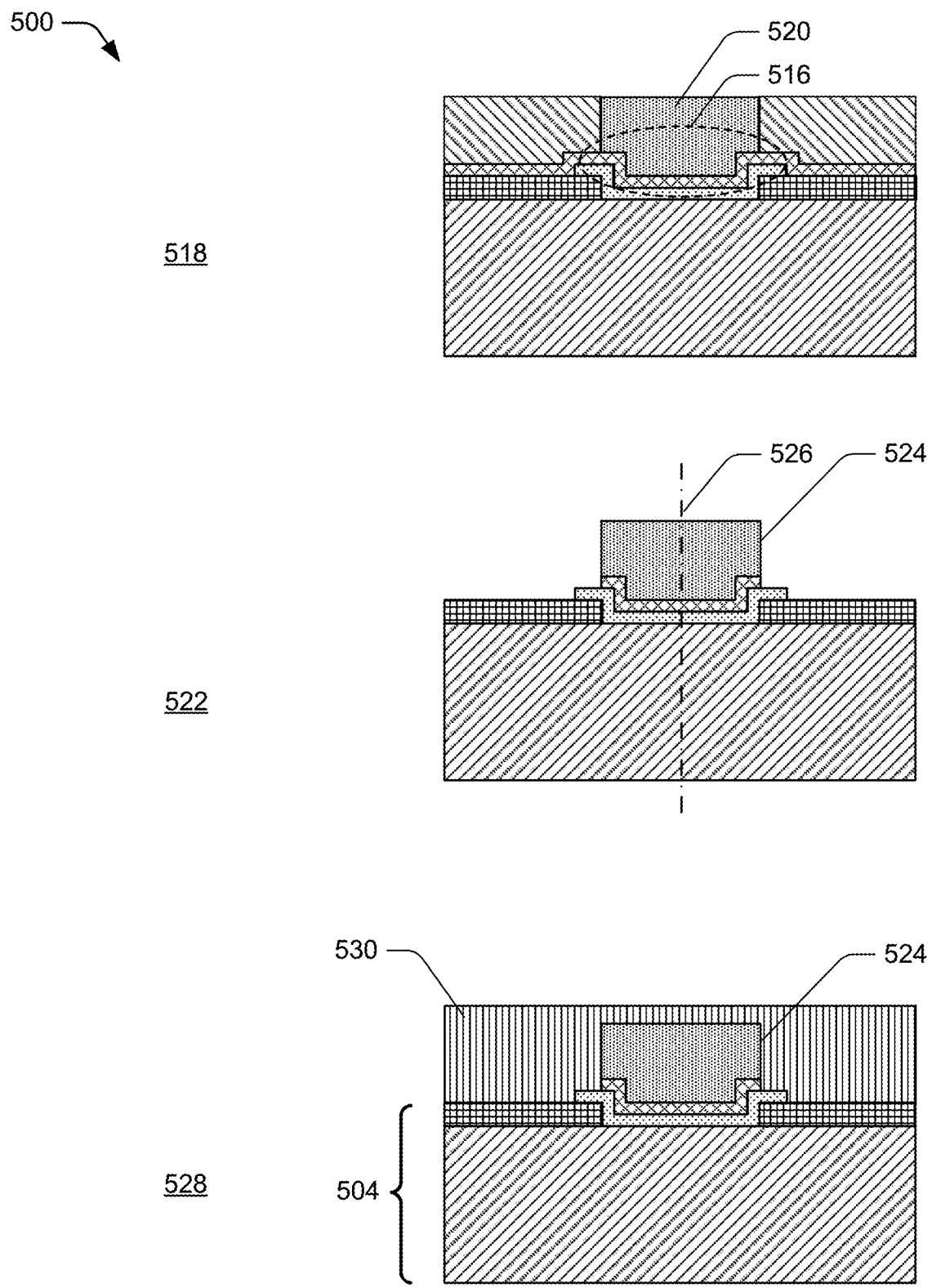
Figure 5C:
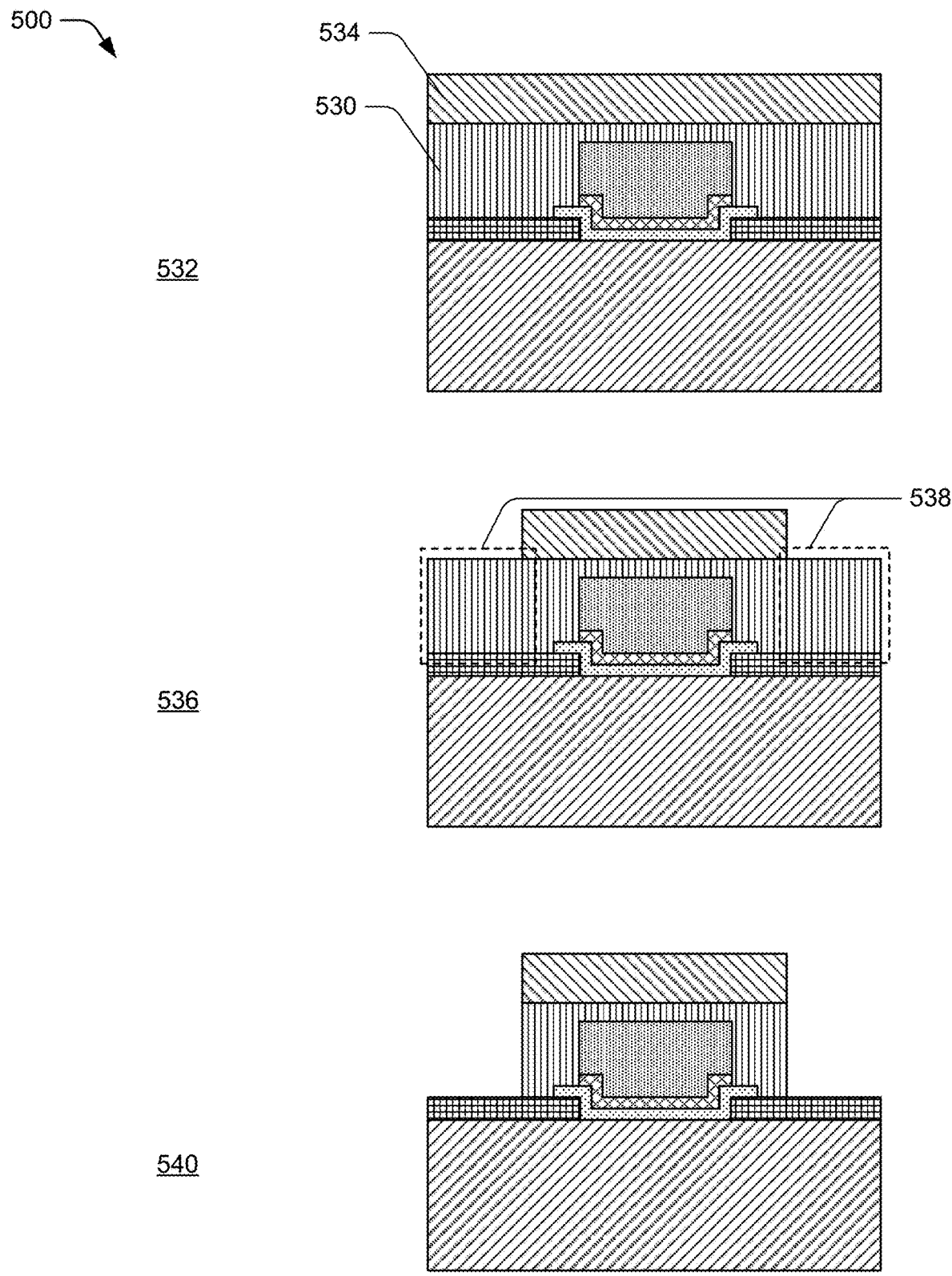
Figure 5D:
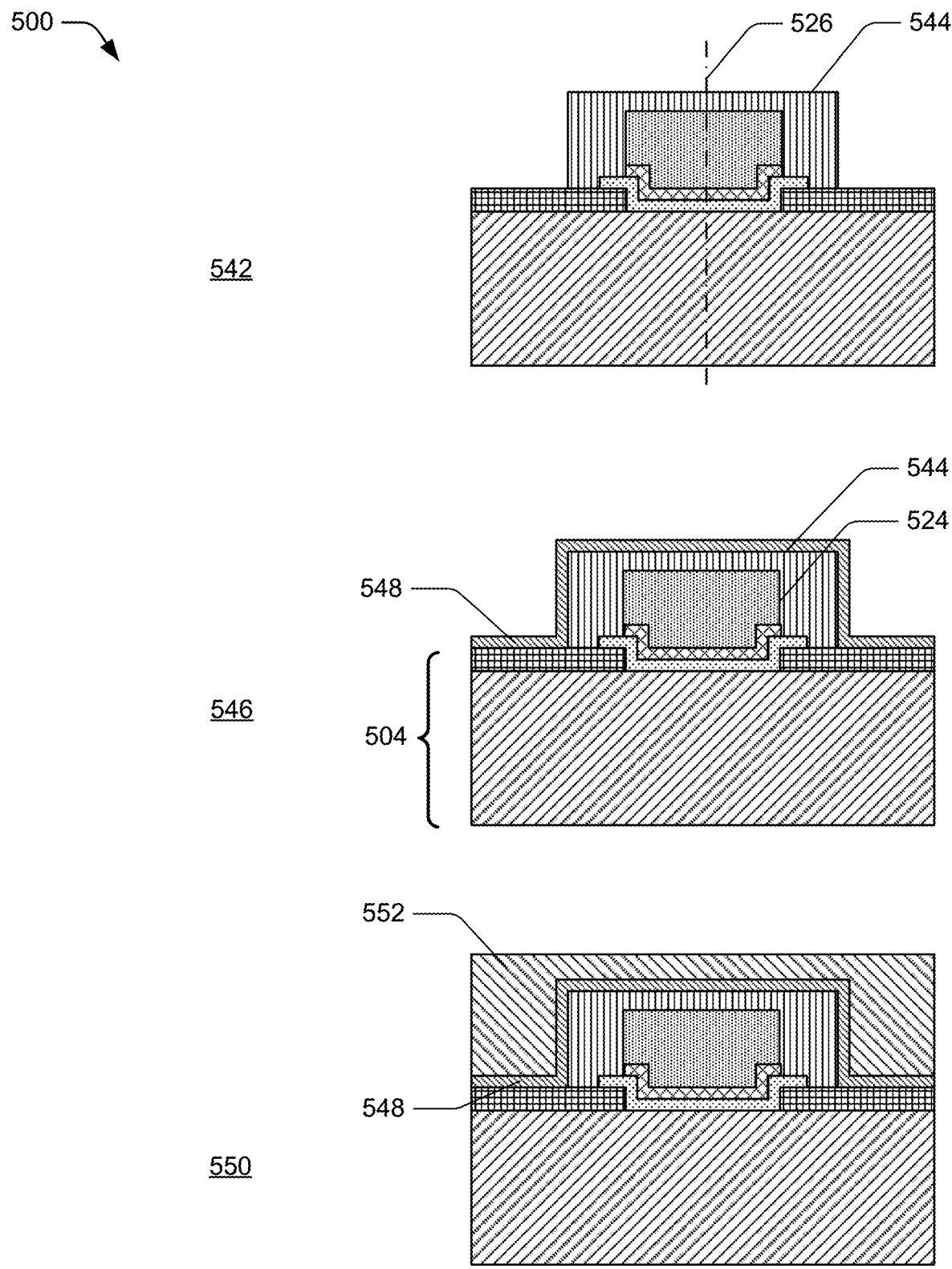
Figure 5E:
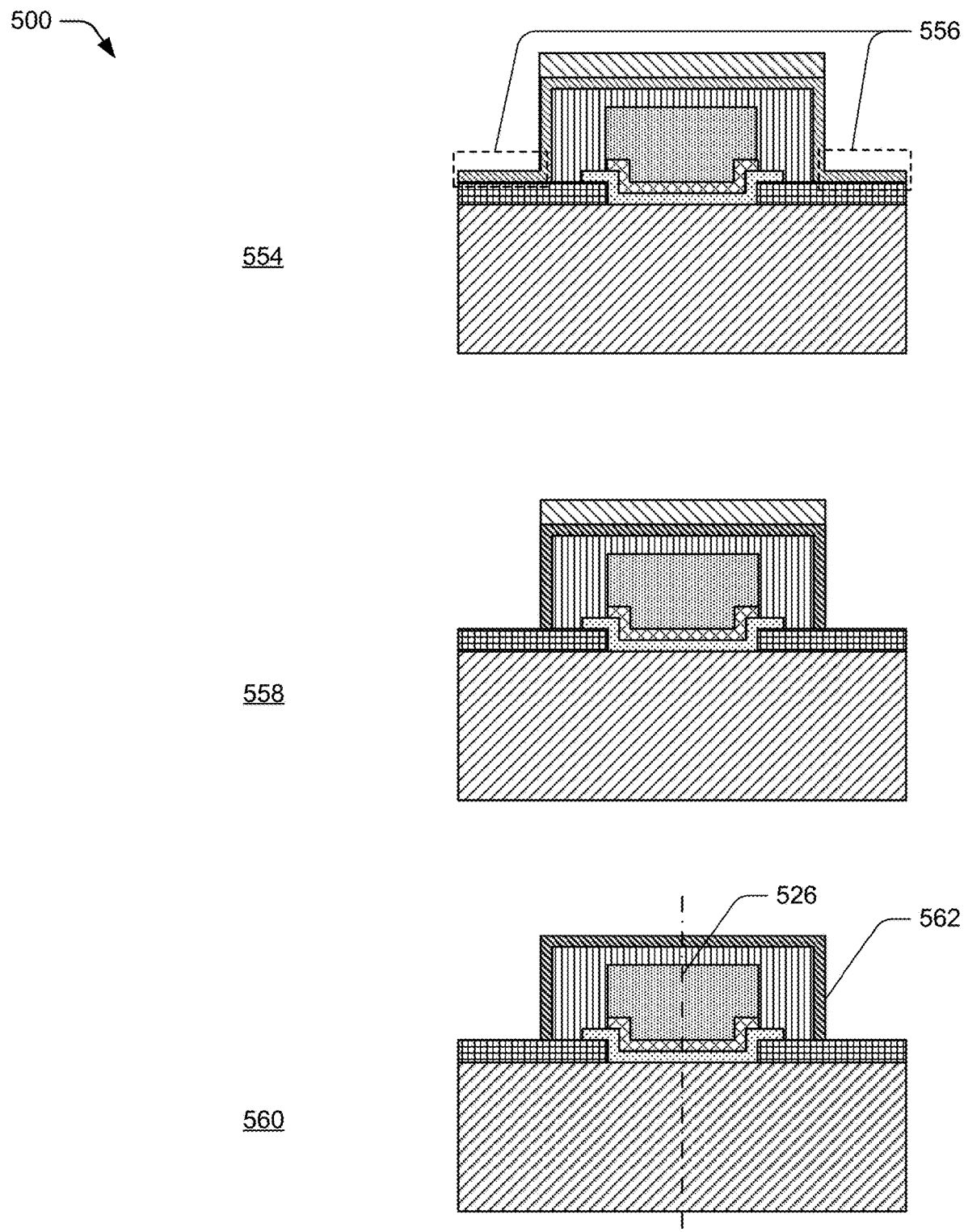
Figure 5F:
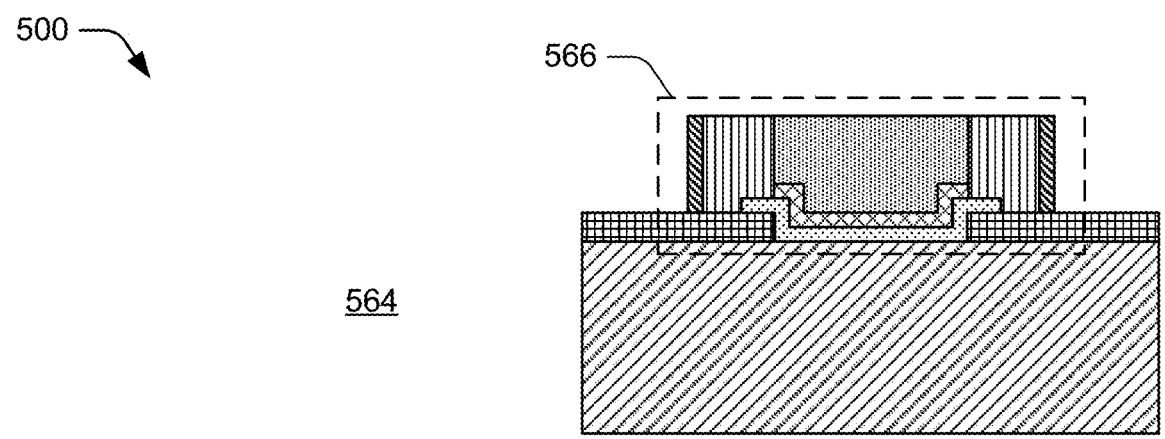

In the context of the ongoing example and as illustrated at operation 522 of FIG. 5b, a remaining portion of the first coating of material has been removed and an exposed portion of the first layer of material has been etched to render a signal core 524. Further, as illustrated at operation 522 of FIG. 5b, the signal core 524 is elongated about an axis 526.

At 412 of FIG. 4a, the method 400 continues. As part of the method at 412, operations deposit a dielectric material onto the material stack that includes the signal core. As an example, a deposition tool such as a physical vapor deposition (PVD) tool or a chemical vapor deposition (CVD) tool (not illustrated in FIG. 1), may deposit a dielectric material such as a polyimide (PI) material, a polybenzoxazole (PBO) material, or a borophosphosilicate glass (BPSG) material onto the material stack. In the context of the ongoing example and as illustrated at operation 528 of FIG. 5b, a dielectric material 530 has been deposited onto the material stack 504 including the signal core 524.

Continuing with the method 400, and as illustrated at 414 of FIG. 4b, operations deposit a second coating of photoresist material onto the dielectric material. The photoresist material may be a positive photoresist material that, when irradiated by an energy source, changes properties such that the photoresist material (that is irradiated) may be removed by a developing tool. In view of the ongoing example and as illustrated at operation 532 of FIG. 5c, a second coating of photoresist material 534 is deposited onto the dielectric material 530 by a coating tool (not illustrated in FIG. 1).

Continuing with the method 400, at 416 of FIG. 4b a second photolithography operation irradiates and removes a same portion of the first coating of photoresist material to expose a portion of the dielectric material. In this example instance, the photoresist material is a "positive" photoresist material. The photolithography-exposure tool 106 of FIG. 1 may, with the assistance of a photolithography mask that is configured to mask a pattern of irradiation across the IC die 114, irradiate a same portion of the second coating of photoresist material as that which is subsequently removed via a developing tool (not illustrated in FIG. 1). In the context of the ongoing example and as illustrated at operation 536 of FIG. 5c, a same portion (not illustrated) of the second coating of photoresist material 534 has been irradiated and removed to reveal a portion of the dielectric material 538.

At 418 of FIG. 4b, the method 400 continues, removing the exposed portion of the dielectric material. The operations may be performed, for example, by the etch tool 108 of FIG. 1. In the setting of the ongoing example and as illustrated at operation 540 of FIG. 5c, the exposed portion of the dielectric material (illustrated as 538 at operation 536) has been removed.

Proceeding with the method 400 at 420 of FIG. 4b, operations remove a remaining portion of the second coating of photoresist material to render an insulator that is elongated about the axis. For example, an ashing tool (not illustrated in FIG. 1) may remove a remaining portion of the second coating of photoresist material. In the context of the ongoing example and as illustrated at operation 542 of FIG. 5d, a remaining portion of the second coating of photoresist material has been removed to render an insulator 544 that is elongated about the axis 526.

At 422 of FIG. 4b, the method 400 continues, depositing a third conductive material onto the material stack (including the signal core and the insulator). The deposition of the third conductive material may be performed by, as an example, a sputtering tool, a chemical vapor deposition (CVD) tool, or a physical vapor deposition (PVD) tool (not illustrated in FIG. 1). The third conductive material may be a material composition that includes, as an example, one or more of the elements nickel (Ni), copper (Cu), aluminum (Al), or tin (Sn). In view of the ongoing example and as illustrated at operation 546 of FIG. 5d, a third layer of conductive material 548 has been deposited onto the material stack 504 including the signal core 524 and the insulator 544.

Proceeding with the method 400 at 424 of FIG. 4c, operations deposit onto the third conductive material a third coating of photoresist material. The photoresist material may be a positive photoresist material that, when irradiated by an energy source, changes properties such that the photoresist material (that is irradiated) may be removed by a developing tool. In the setting of the ongoing example and as illustrated at operation 550 of FIG. 5d, a third coating of photoresist material 552 is deposited onto the third conductive material 548 by a coating tool (not illustrated in FIG. 1).

At 426 of FIG. 4c, the method 400 continues, where a third photolithography operation irradiates and removes a same portion of the third coating of photoresist material to expose a portion of the third conductive material. In this example instance, the photoresist material is a "positive" photoresist material. The photolithography-exposure tool 106 of FIG. 1 may, with the assistance of a photolithography mask that is configured to mask a pattern of irradiation across the IC die 114, irradiate a same portion of the third coating of photoresist material as that which is subsequently removed via a developing tool (not illustrated in FIG. 1). In the context of the ongoing example and as illustrated at operation 554 of FIG. 5e, a same portion (not illustrated) of the third coating of photoresist material 552 has been irradiated and removed to reveal a portion of the third conductive material 556.

Continuing with the method 400, at 428 of FIG. 4c operations remove the exposed portion of the third conductive material. The operations may be performed, for example, by the etch tool 108 of FIG. 1. In view of the ongoing example and as illustrated at operation 558 of FIG. 5e, the exposed portion of the dielectric material (illustrated as 556 at operation 554) has been removed.

At 430 of FIG. 4c, the method 400 continues and operations remove a remaining portion of the third coating of photoresist material to render a ground shield that is elongated about an axis. For example, an ashing tool (not illustrated in FIG. 1) may remove a remaining portion of the third coating of photoresist material. In the context of the ongoing example and as illustrated at operation 560 of FIG. 5e, a remaining portion of the third coating of photoresist material has been removed to render a ground shield 562 that is elongated about the axis 526.

The method continues at 432 of FIG. 4c, where operations polish the signal core, the insulator, and the ground shield to render a coaxial-interconnect structure. Such operations may be performed by one or more tools that include an electro-chemical polishing tool or a backgrind tool (not illustrated in FIG. 1). In the context of the ongoing example and as illustrated at operation 564 of FIG. 5f, the signal core, the insulator, and the ground shield have been polished to render the coaxial-interconnect structure 566.

Additional tools may perform operations that connect an IC die having such the coaxial-interconnect structure 566 to a packaging substrate as part of a semiconductor component. Such tools may include, for example, thermocompression tools (for thermocompression bonding), dispense tools (for underfilling the IC die), and solder reflow tools (for solder-based bonding), or the like.

VARIATIONS

Variations are possible for the aforementioned construct of the coaxial-interconnect structure and also for the aforementioned fabrication operations.

As one example of a variation in construct, a dielectric material used to form the insulator (e.g., the insulator 218 of FIG. 2) may in some instances may be material in a gaseous phase (such as air) as opposed to a material that is in a solid phase.

As another example of a variation in construct, and as part of advanced semiconductor packaging techniques, the packaging substrate (e.g., the packaging substrate 206 of FIG. 2) may be a silicon interposer or another integrated-circuit die having through-silicon via (TSV) interconnects.

As an example of a variation in fabrication techniques, photolithography operations may be based on a "negative" photoresist material as opposed to the described "positive" photoresist material. In such instances, an irradiated portion of photoresist material and a removed portion of photoresist material would not be the same portion of material as described above.

As another example of a variation in fabrication techniques, certain instances of fabrication operations may include fabricating coaxial-interconnect structure onto the packaging substrate (e.g., the packaging substrate 206 of FIG. 2) as opposed to an IC die (e.g., the IC die 114). Although the tools performing the fabrication operations on the packaging substrate would be different than those as illustrated and described in FIG. 1, operations would mirror those as described the method 400.

Although the subject matter has been described in language specific to structural features and/or methodological operations, it is to be understood that the subject matter defined in the appended claims is not necessarily limited to the specific features or operations described herein, including orders in which they are performed.

What is claimed is:
1. A semiconductor component comprising:
    a packaging substrate having complementary signal and ground traces that are formed at separate conductive layers of the packaging substrate;
    an integrated-circuit (IC) die having complementary signal and ground pads; and a coaxial-interconnect structure, the coaxial-interconnect structure being configured to electrically couple the complementary signal and ground pads of the IC die to the complementary signal and ground traces of the packaging substrate, wherein at least two elements of the coaxial-interconnect structure are deposited onto the complementary signal and ground pads of the IC die, the elements of the coaxial-interconnect structure comprising:

a signal core elongated about an axis that is (i) orthogonal to a plane of the IC die that contains the signal and ground pads and (ii) orthogonal to a plane of the packaging substrate that contains the corresponding signal and ground traces;

a ground shield elongated about the axis and disposed such that the ground shield encloses a perimeter of the signal core; and an insulator disposed between the signal core and the ground shield.

2. The semiconductor component as recited in claim 1, wherein the packaging substrate is a multiple-layer printed circuit board (PCB).

3. The semiconductor component as recited in claim 2, where the multiple-layer printed circuit board (PCB) is formed from composite fiber-based epoxy materials and includes multiple layers of copper or aluminum.

4. The semiconductor component as recited in claim 1, wherein the packaging substrate is a silicon interposer that has through-silicon (TSV) interconnects.

5. The semiconductor component as recited in claim 1, wherein the integrated-circuit die is a memory die that is a dynamic random-access memory (DRAM) die or a flash memory die.

6. The semiconductor component as recited in claim 1, wherein the integrated-circuit die is a logic die.

7. The semiconductor component as recited in claim 1, wherein the integrated-circuit die is a system-on-chip (SoC) die.

8. The semiconductor component as recited in claim 1, wherein the signal core is copper (Cu) material.

9. The semiconductor component as recited in claim 1, wherein the signal core is a titanium (Ti) or a tungsten (W) material.

10. The semiconductor component as recited in claim 1, wherein the insulator is a polyimide (PI) material, a polybenzoxazole (PBO) material, or a borophosphosilicate glass (BPS G) material.

11. The semiconductor component as recited in claim 1, wherein the insulator is a material that is in a gaseous phase.

12. The semiconductor component as recited in claim 1, wherein the ground shield is a copper (Cu) material.

13. The semiconductor component as recited in claim 1, wherein the ground shield is a tin (Sn) material.

14. A semiconductor component comprising:
a packaging substrate having complementary signal and ground traces that are formed at a common conductive layer of the packaging substrate;

an integrated-circuit (IC) die having complementary signal and ground pads; and a coaxial-interconnect structure, the coaxial-interconnect structure being configured to electrically couple the complementary signal and ground pads of the IC die to the complementary signal and ground traces of the packaging substrate, wherein at least two elements of the coaxial-interconnect structure are deposited onto the complementary signal and ground pads of the IC die, the elements of the coaxial-interconnect structure comprising:

a signal core elongated about an axis that is (i) orthogonal to a plane of the IC die that contains the signal and ground pads and (ii) orthogonal to planes of the packaging substrate that contain the corresponding signal and ground traces;

a ground shield elongated about the axis and disposed such that the ground shield encloses a portion of a perimeter encircling the signal core; and an insulator disposed between the signal core and the ground shield.

15. The semiconductor component as recited in claim 14, wherein the packaging substrate is a single-layer printed circuit board (PCB) that comprises composite fiber-based epoxy materials and includes a single layer of copper or aluminum.

16. The semiconductor component as recited in claim 14, wherein the integrated-circuit die is a memory die that is a dynamic random-access memory die or a flash memory die, a logic die, or a system-on-chip die.

17. The semiconductor component as recited in claim 14, wherein the signal core is copper (Cu) material.

18. The semiconductor component as recited in claim 14, wherein the signal core is a titanium (Ti) or a tungsten (W) material.

19. The semiconductor component as recited in claim 14, wherein the insulator is one of a polyimide (PI) material, a polybenzoxazole (PBO) material, or a borophosphosilicate glass (BPS G) material.

20. The semiconductor component as recited in claim 14, wherein the ground shield is a copper (Cu) material.

\* \* \* \* \*